United States Patent
Berlin, Jr. et al.

(10) Patent No.: US 9,634,169 B1
(45) Date of Patent: Apr. 25, 2017

(54) HYBRID SOLAR CONCENTRATOR UTILIZING A DIELECTRIC SPECTRUM SPLITTER

(71) Applicant: LightSail Energy, Inc., Berkeley, CA (US)

(72) Inventors: Edwin P. Berlin, Jr., Oakland, CA (US); Stephen E. Crane, Oakland, CA (US); Danielle Fong, Oakland, CA (US)

(73) Assignee: LIGHTSAIL ENERGY, INC., Berkeley, CA (US)

( * ) Notice: Subject to any disclaimer, the term of this patent is extended or adjusted under 35 U.S.C. 154(b) by 242 days.

(21) Appl. No.: 14/488,216

(22) Filed: Sep. 16, 2014

Related U.S. Application Data (60) Provisional application No. 61/883,901, filed on Sep. 27, 2013, provisional application No. 61/888,390, filed on Oct. 8, 2013, provisional application No. 61/894,847, filed on Oct. 23, 2013.

(51) Int. Cl.
| | |
|---|---|
| *H01L 31/00* | (2006.01) |
| *H01L 31/052* | (2014.01) |
| *H01L 31/053* | (2014.01) |
| *G01S 3/786* | (2006.01) |
| *H01L 31/042* | (2014.01) |
| *F24J 2/10* | (2006.01) |
| *F24J 2/34* | (2006.01) |

(52) U.S. Cl.
CPC ........ *H01L 31/0528* (2013.01); *F24J 2/1057* (2013.01); *F24J 2/34* (2013.01); *G01S 3/7861* (2013.01); *H01L 31/0422* (2013.01); *H01L 31/0586* (2013.01)

(58) Field of Classification Search
CPC .............. H01L 31/052; H01L 31/0525; H01L 31/0549; H01L 31/0547; H01L 31/054; H01L 31/042; F24J 2/1057; F24J 2/34; F24J 2002/1066; F24J 2002/1071; H02S 10/30; Y02E 10/60
USPC ........................................ 136/248, 246, 259
See application file for complete search history.

(56) References Cited

U.S. PATENT DOCUMENTS

2007/0023079 A1* 2/2007 Mills .................... F24J 2/06
  136/246
2011/0115223 A1 5/2011 Stahlkopf et al.

* cited by examiner

*Primary Examiner* — Marla D. McConnell
*Assistant Examiner* — Dujuan Horton (57) ABSTRACT

A hybrid solar concentrator that utilizes one or more dielectric mirrors to isolate components of the solar spectrum compatible with specific PV band-gaps and to pass longer wavelengths through to a heat receiver, generating both electricity and heat from a single set of dual-axis heliostats.

17 Claims, 7 Drawing Sheets

HYBRID SOLAR CONCENTRATOR UTILIZING A DIELECTRIC SPECTRUM SPLITTER

CROSS-REFERENCE TO RELATED APPLICATIONS

The instant nonprovisional patent application claims priority to the following U.S. provisional patent applications, each of which is incorporated by reference herein for all purposes: U.S. Provisional Patent Application No. 61/883,901, filed Sep. 27, 2013; U.S. Provisional Patent Application No. 61/888,390, filed Oct. 8, 2013; and U.S. Provisional Patent Application No. 61/894,847, filed Oct. 23, 2013.

BACKGROUND

The present invention relates generally to a hybrid solar concentrator, a system having the hybrid solar concentrator, and associated methods.

SUMMARY

Embodiments of the present invention provide for a hybrid solar concentrator that utilizes one or more dielectric mirrors to isolate components of the solar spectrum compatible with specific PV band-gaps and to pass longer wavelengths through to a heat receiver, generating both electricity and heat from a single set of dual-axis heliostats.

The details of one or more implementations are set forth in the accompanying drawings and the description below. Other features, aspects, and advantages may become apparent from the description, the drawings, and the claims.

DESCRIPTION

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

The present invention is directed to a hybrid solar concentrator, a system having the hybrid solar concentrator, and associated methods. In one embodiment, the hybrid solar concentrator utilizes one or more dielectric mirrors to isolate components of the solar spectrum compatible with specific PV band-gaps and to pass longer wavelengths through to a heat receiver, generating both electricity and heat from a single set of dual-axis heliostats. Embodiments may be stand-alone hybrid solar collectors that meet the requirements of FOCUS FOA category 1A.

Figure 1:
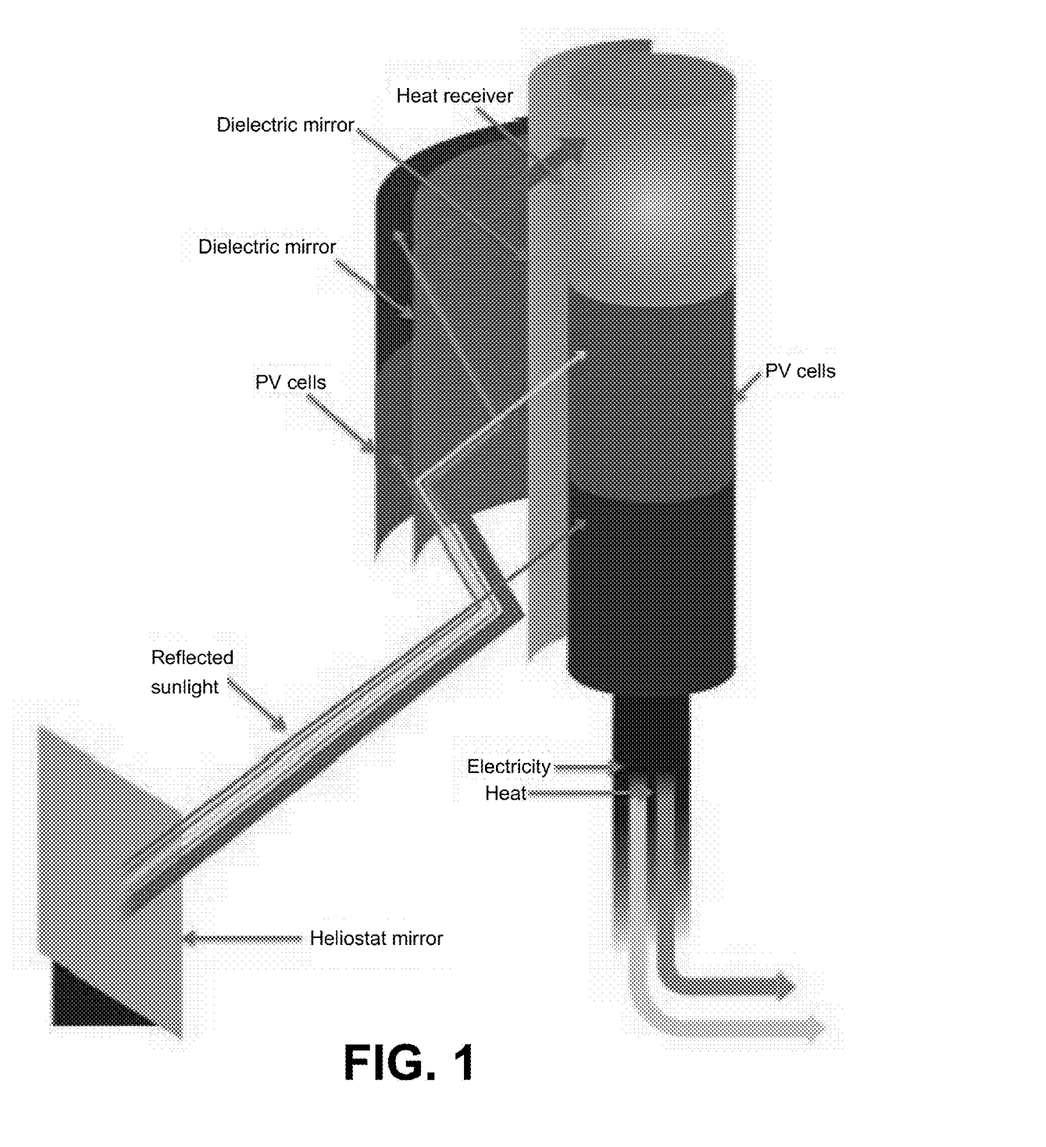
FIG. 1 illustrates the system having the concentrator and hybrid receiver, in accordance with embodiments of the present invention.

FIG. 1 shows a system having the concentrator and hybrid receiver, in accordance with embodiments of the present invention. In one embodiment, the system 100 includes:
1. Heliostat mirrors 102 with two-axis trackers that focus sunlight onto a central tower;
2. Dielectric mirrors 104 near the focal point that allow a selected range of wavelengths to pass through and reflect wavelengths outside of that band;
3. PV cells 106 that convert the pass-through wavelengths to electricity; and
4. A heat collector 108 that captures the long-wavelength sunlight The dielectric mirrors, in accordance with embodiments of the present invention, may split the sunlight components into different wavelength bands. Embodiments may use pneumatically actuated trackers, and the geometry of concentrating mirrors, dielectric splitters, and the heat receiver that makes the system practical and low-cost.

Pneumatic trackers are very low cost, enabling the use of small heliostat mirrors, which, in turn, allow practical systems as small as 50 kW to be implemented. Dielectric mirrors will be designed of high-temperature tolerant materials that pass wavelength ranges matched to the band-gaps of specific PV semiconductor types (e.g. InGaP for 1.86 eV, Si for 1.1 eV, etc.). The system geometry balances solar concentration ratio, receiver acceptance angles, number of optical elements, and focal areas to keep temperatures in the desired range on all collector components. Simple active cooling (fans and water circulation) will likely be necessary for the dielectric mirrors and PV cells.

One embodiment may implement full solar concentration (approximately 1000x), spectral splitting (using a single dielectric mirror), and heat and PV capture at very small scale using a modified reflecting telescope. Another embodiment may implement a single full-sized heliostat (about 0.5 m$^2$) and the complete optical path at full scale (but with limited concentration). These embodiments will demonstrate the basic capabilities of the system and help to refine many of its details, specifically:

Ratio of the concentrator area to the dielectric mirror area and heat receiver area;

Temperatures at the dielectric mirror, PV array(s), and heat receiver;

Range of practical tracking angles; and

Mechanical precision required for each component and a method to achieve it.

The table below illustrates the target level of performance in accordance to the embodiments of the present invention.

| Category | Value | Notes |
| --- | --- | --- |
| Energy efficiency | 65% to 72% | Depends on no. of splits and concentration |
| Fraction of energy delivered as heat | 50% to 75% | Depends on number of splittings |
| Temperature of heat provided | 600° C. | Depends on concentration |
| Collection area of prototype | 0.5 m$^2$ | For the larger of the two prototypes |
| Cost per unit of delivered energy | $1/watt | For a high-volume product |
| Field life | 25+ years | |

Embodiments of the present invention provides high energy efficiency due to high concentration of light both on the PV cells and the heat receiver. Because each component is cheap, the cost of this concentrated PV system should be lower than that of a non-concentrated system of the same aperture. The heat energy is captured almost for free. In one embodiment, only a collector and heat transfer fluid are required.

In accorance to embodiments of the present invention, solar energy is collected simultaneously as PV and heat using dielectric beam splitters. The embodiments do not require liquid cooling of the PV cells, and thus do not limit the concentration ratio and/or the PV efficiency. Accordingly, in accorance to embodiments of the present invention, much of the energy that would cause the PV to heat up is removed via the dielectric mirror, allowing higher concentration factors.

In accorance to embodiments of the present invention, CSP/CPV may be made cost-effectively at both small and large scales.

Figure 2:
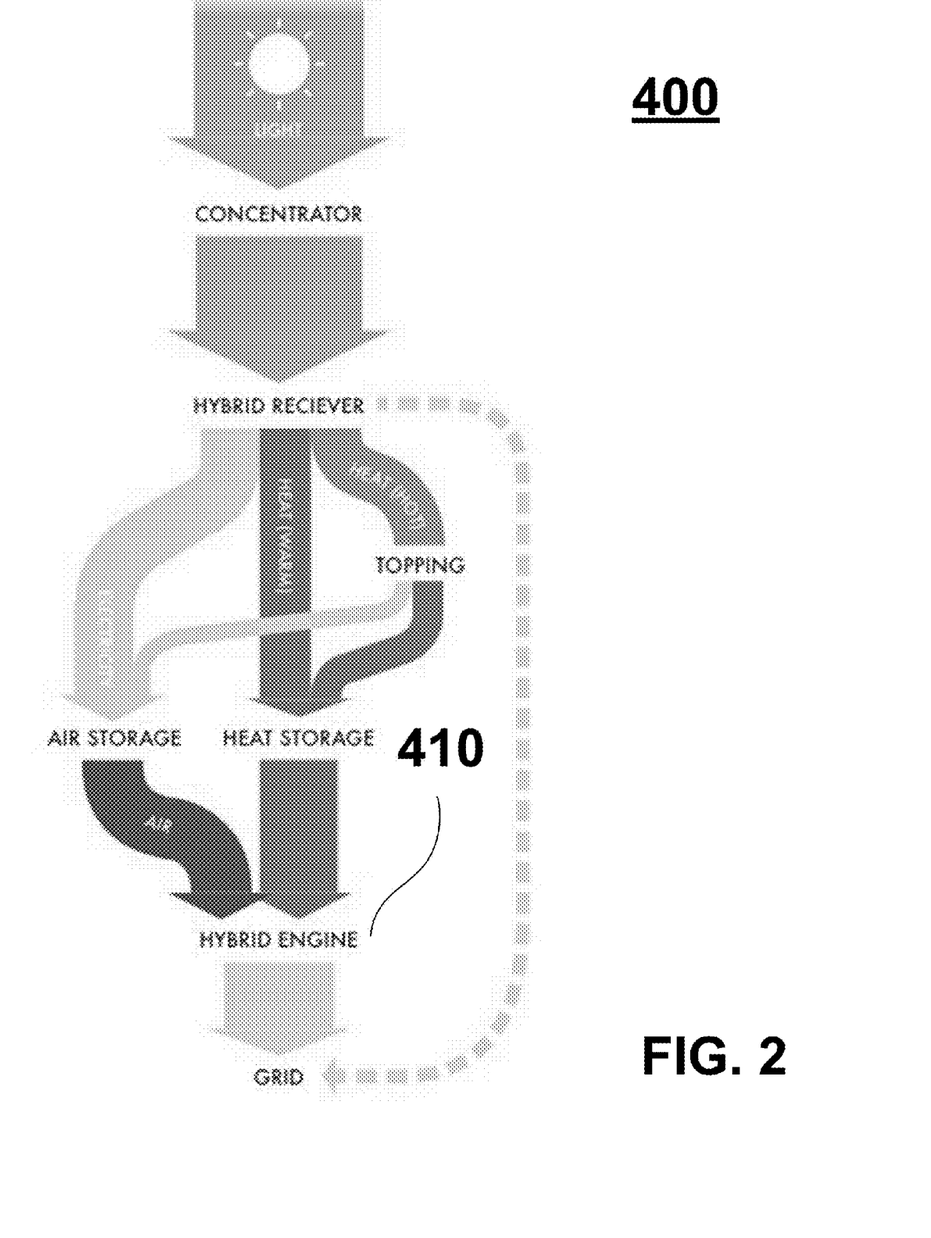
FIG. 2 illustrates a diagram of the solar energy conversion system as a stand-alone sub-system, in accordance with the embodiments of the present invention.

FIG. 2 illustrates a diagram of a complete solar energy conversion system. In an embodiment, the system is as a stand-alone sub-system (specifically, the concentrator and hybrid receiver components).

Hybrid Electrical and Heat Energy Storage and Quasi-Carnot Conversion

Recently, approaches employing compressed gas as an energy storage medium, have emerged. In particular, compressed air is capable of storing energy at densities comparable to lead-acid batteries. Moreover, compressed gas does not involve issues associated with a battery such as limited lifetime, materials availability, or environmental friendliness.

Embodiments as described herein relate to a hybrid heat/electricity storage system utilizing a heat engine. In particular embodiments, electrical energy is converted to, and stored as, compressed air.

A heat engine receives as inputs, stored compressed gas and heat. The engine generates work using a multiphase approach to approximate a Carnot cycle. In particular, the stored compressed gas is further adiabatically compressed, and then successively expanded near-isothermally and then adiabatically. The second compression step and the two expansion steps all take place with a phase change material, with supercritical phase change material injected during the first (near-isothermal) expansion. The supercritical phase change material introduces enthalpy and mass into the expanding fluid. The compressed gas may be supplied by near-isothermal compression in the presence of a heat exchange liquid (e.g. water droplets in air). Power to run compression stage(s), as well as thermal energy for heating the supercritical phase change material (which can be water), may be supplied as electricity and heat respectively received from a solar collector.

Heat may be stored near-isothermally, using a phase change material. In certain embodiments this phase change material comprises liquid water. However, embodiments are not limited to this or any other phase change material.

The heat engine takes the stored air and heat as input and generates work using a quasi-Carnot cycle. In particular, the heat engine uses a multiphase approach in order to approximate a Carnot cycle.

Figure 3:
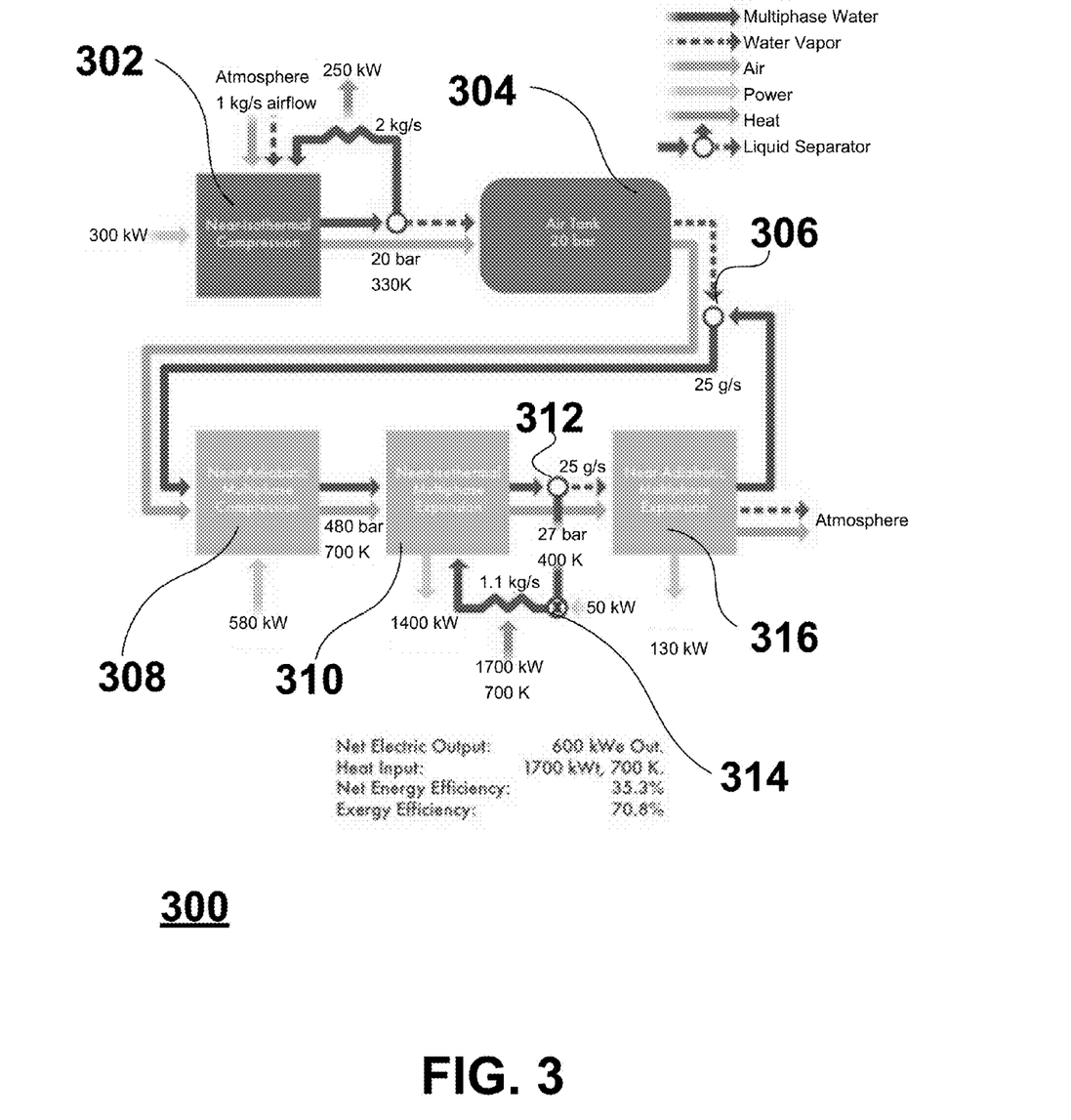
FIG. 3 is simplified view of a quasi-Carnot cycle according to an embodiment.

FIG. 3 is a simplified plot of a quasi-Carnot cycle according to an embodiment. In particular, each leg of the quasi-Carnot cycle shown in FIG. 3, represents a mechanical system. The following steps in the quasi-Carnot cycle 300 are represented in FIG. 3.

Step 302 is near-isothermal air compression/air storage. The electricity generated by a solar collector (or some other source) may be used to run a motor (or motor-generator) that drives a gas compressor operating within a narrow temperature range and exhibiting near-isothermal thermodynamic characteristics.

In a particular embodiment, water is sprayed into the compression volume to absorb the heat of compression. Certain compressed gas energy storage approaches are described in U.S. Patent Publication No. 2011/0115223 ("the Publication"), which is incorporated by reference in its entirety herein for all purposes. According to the Publication, gas may be compressed in the presence of liquid water as a heat exchange medium. That is, heat generated from the compression of gas is transferred across a gas-liquid boundary (e.g. fine droplets), such that the temperature experienced by the gas remains within a relatively small range over the course of the course of the compression cycle. This enhances the thermodynamic efficiency of the compression process. The transferred heat of gas compression may be retained in the heated water, and may be available for other uses.

A compressor as described in the Publication, may utilize a reciprocating or rotating moveable member for gas compression. An example of the former is a solid piston connected to a mechanical linkage comprising a piston rod and rotating shaft (e.g. crankshaft). An example of the latter is a rotating turbine, screw, or other structure connected to a mechanical linkage comprising a rotating shaft.

In certain embodiments, liquid may be introduced directly into the compression chamber for heat exchange. In certain embodiments, liquid may be introduced to gas in a mixing chamber upstream of the compression chamber.

Returning to FIG. 3, in step 304 the water is removed via a liquid separator, and the compressed air is stored in a tank or other storage unit. In certain embodiments, this storage unit could be an underground feature such as a mine or natural formation.

In step 306, some amount of water is sprayed into the air before the next compression stage occurs. This serves to balance the mass flows, and to ensure that processes take place near saturation pressures/equilibrium.

In step 308, near-adiabatic multi-phase compression is performed. This step may involve a compression process in which no additional water is sprayed. The temperature exceeds the water supercritical point.

Step 310 shows near-isothermal multi-phase expansion, with supercritical water injection. This water injection introduces enthalpy and mass into the expanding fluid. This high temperature, high-pressure expansion phase provides the majority of the power in the system.

Step 312 shows the temperature dropping below the critical temperature, and liquid water being separated out.

In step 314 the liquid water is pumped up to higher pressure, and then heated by the heat storage, and injected into the compression step 310 just described. In certain embodiments, the heat may be stored in a salt mixture with a melting point just below the expander's operating point, so that the heat is provided near-isothermally.

In Step 316, near-adiabatic air/steam expansion is performed. Some condensation/nucleation occurs on the tiny droplets (~1µ) that aren't separated out. The final result is a 1 atm gas at near ambient temperature, plus liquid water, and some small amount of water vapor in the humid air.

The processes as described above are specifically designed so as to minimize thermodynamic losses. In particular temperature mixing is minimized and the majority of the heat in the system is added isothermally, making optimal use of the incoming heat stream.

Accordingly, embodiments may be especially well adapted for pairing with solar collectors, or topping cycles which reject heat near isothermally. Thermodynamic losses attributable to boiling, free expansion, and mixing, are avoided.

The ideal cycle shown in FIG. 3 thus approximates Carnot efficiency. In order to encapsulate realistic losses attributable to friction and other sources, FIG. 1 shows exemplary estimates assuming approximately 80% one-way electric and mechanical efficiencies.

In FIG. 3, each step has unique aspects (e.g. injection of supercritical steam in the isothermal expander). In certain embodiments, all four processes may be implemented independently as reciprocating piston engines.

In specific embodiments, all of the elements can be integrated into a single compact system running on a common crankshaft. Such mechanisms may have a long service life with minimal degradation in performance.

The quasi-Carnot cycle just described above, may be matched to a hybrid solar heat/electricity generator. In particular, FIG. 2 shows a schematic diagram of a solar energy conversion system 200, which includes the heat storage and air storage and the hybrid engine, as a standalone sub-system 210 apart from the solar collector comprising a concentrator and hybrid receiver. The combination results in dispatchable solar power that can compete with certain forms of fossil fuel electricity generation (e.g. diesel).

1a. An apparatus comprising:
  a first compressor in communication with a first power source and configured to operate within a first temperature range;
  a compressed gas storage unit in fluid communication with the first compressor;
  a second compressor in communication with a second power source and configured to further compress gas received from the compressed gas storage unit in the presence of a phase change material, the second compressor configured to operate within a second temperature range larger than the first temperature range;
  a first expander configured to expand gas received from the second compressor in the presence of a supercritical phase change material heated by a thermal energy source, the first expander configured to operate within a third temperature range; and
  a second expander configured to further expand gas received from the first expander in the presence of a phase change material, the second expander configured to operate within a fourth temperature range larger than the third temperature range.

2a. An apparatus as in clause 1a wherein the compressed gas comprises air, the phase change material comprises water, and the supercritical phase change material comprises water.

3a. An apparatus as in clause 1a wherein the first compressor is configured to operate in the first temperature range by injection of a heat transfer liquid.

4a. An apparatus as in clause 3a wherein the heat transfer liquid is separated from an output of the first compressor.

5a. An apparatus as in clause 1a wherein the first expander is configured to operate in the third temperature range by the injection of a heat transfer liquid.

6a. An apparatus as in clause 5a wherein the heat transfer liquid is separated from an output of the first expander.

7a. An apparatus as in clause 5a wherein the thermal energy source is in communication with the heat transfer liquid prior to injection into the first expander.

8a. An apparatus as in clause 5a wherein the supercritical phase change material comprises water, and the thermal energy source comprises a salt mixture having a melting point below a bottom point of the third temperature range.

9a. An apparatus as in clause 1a wherein the first power source comprises electricity from a solar collector.

10a. An apparatus as in clause 1a wherein the second power source comprises electricity from a solar collector.

11a. An apparatus as in clause 1a wherein the thermal energy source comprises heat from a solar collector.

12a. An apparatus as in clause 1a further comprising a liquid injector positioned between the compressed gas storage unit and the first expander.

13a. A method comprising:
  receiving a compressed gas input;
  generating further compressed gas from the compressed gas input in the presence of a phase change material;
  expanding the further compressed gas in the presence of a supercritical phase change material heated by a heat source to add mass and enthalpy to an expanding fluid;
  extracting kinetic energy from the expanding fluid;
  further expanding the expanding fluid in the presence of a phase change material; and
  extracting kinetic energy from the further expanding fluid.

14a. A method as in clause 13a wherein the compressed gas input is generated by compressing gas within a temperature range in the presence of a heat transfer liquid.

15a. A method as in clause 13a wherein the compressed gas comprises air, and the supercritical phase change material comprises water.

16a. A method as in clause 13a wherein heat source comprises a solar collector.

17a. A method as in clause 13a wherein the generating of further compressed gas is driven by electricity from a solar collector.

18a. A method as in clause 13a wherein extracting kinetic energy from the expanding fluid comprises driving a reciprocating piston.

19a. A method as in clause 13a wherein extracting kinetic energy from the expanding fluid comprises driving a rotating vane.

20a. A method as in clause 13a further comprising generating electricity from the kinetic energy.

Hybrid Energy Storage System Based on Compressed Air

Recently, approaches employing compressed gas as an energy storage medium, have emerged. In particular, compressed air is capable of storing energy at densities comparable to lead-acid batteries. Moreover, compressed gas does not involve issues associated with a battery such as limited lifetime, materials availability, or environmental friendliness.

Embodiments as described herein relate to a hybrid energy storage system utilizing compressed air as a storage medium for mechanical and/or electrical energy. In addition the system may include a separate thermal energy store. According to embodiments the system could store electricity by compressing air in near-isothermal conditions, and then storing the compressed air above ground or underground in pressure vessels.

A hybrid energy storage system utilizes compressed gas as a storage medium. Certain embodiments may also employ a medium (such as thermic oil) for the collection and storage of heat. Compressed gas (e.g. air) is generated by a near-isothermal compression process, for example employing liquid droplets for heat exchange. The compression process may be driven by electricity harvested from a solar collector, such as may include a concentrated photovoltaic receiver (CPV). Embodiments may regenerate electricity from the stored compressed gas through expansion under adiabatic conditions. This expansion may be performed in multiple stages, with gas heated by heat supplied from solar power (or another source) in one or more of the stages. The expander may comprise a mix of reciprocating piston expanders and turbines. Particular embodiments of expanders may be capable of handling temperatures of about 400° C. representing a compromise of high grade heat conducive to high efficiency, and a low enough temperature to allow the use of a thermic oil, rather than molten salt, and to avoid expensive metals/coatings. To enhance the electricity regeneration, compressed gas may be heated before each successive expansion stage by extracting heat from a thermic oil using a counterflow heat exchanger. In certain embodiments, the thermic oil may be heated by a solar collector.

The system could also store heat in the form of tanks of hot oil. A suitable form of so-called thermic oil for heat transfer up to about 400° C. is commercially available under the name DOWTHERM A and manufactured by the Dow Chemical Company of Midland, Mich. This thermal oil has been used in some solar energy systems.

This thermal oil could also be used to store the heat in large tanks. However, the thermic oil is relatively expensive and the cost of using a large volume of the oil for the purpose of thermal storage may discourage this particular use.

An alternative option is to use the thermic oil as the medium for transferring the heat, but to store the heat in a thermal regenerator, in which the heat transported by the thermic oil is transferred to some suitable low-cost inert solid material with a high heat capacity. The low-cost thermal storage material could, for example, comprise stone pebbles in direct contact with the oil, or it could comprise a low cost material such as sand encased in sealed tubes.

When heat is added to the regenerator from the solar heat source, the flow of oil would be in one particular direction through the solid material. When heat is extracted from the regenerator, the direction of the flow through the regenerator would be reversed. The regenerator could be insulated so that little heat is lost during the storage period.

A variety of different types of heat transfer materials are known, including other varieties of hydrocarbon-based thermic oil such as alternative DOWTHERM fluids (e.g. J, G, MX, Q, T, and RP). Other heat transfer fluids may be silicon-based heat transfer (e.g. SYLTHERM also available from the Dow Chemical Company).

Other inorganic fluids could conceivably be used as a heat transfer fluid. For example, molten salts are employed in some solar applications because they can be used at temperatures up to about 600° C.

Liquid sodium/potassium mixtures and the pure metals have also been used in some advanced nuclear reactor designs. However, the former offer the potential disadvantage of ignition in contact with air or water, and the latter are environmentally toxic.

Liquid water is widely used as a heat transfer liquid. However, it must be maintained pressurized to remain in the liquid phase at high temperatures.

It would be possible to use a thermal storage material which undergoes a phase change as the medium of heat storage. Such an approach could offer the benefit of increasing the heat capacity of the regenerator. However, there is a disadvantage in that the thermal effectiveness of the regenerator would be reduced by the use of latent heat capacity in the storage medium in contrast to the heat transfer medium, which has sensible heat capacity only. This mis-match of the thermal properties could lead to larger temperature differences in the heat transfer process, reducing thermodynamic efficiency.

An application envisaged for embodiments is in the collection of solar energy which combines photovoltaic conversion of solar radiation to electrical energy, with thermal energy collection using a thermic oil as the medium for heat transport to a thermal regenerator as described above. A benefit of such a hybrid solar collection system is that it can deliver more electric energy per square meter of collector than is possible with a photovoltaic system or a thermal solar system acting alone.

A photovoltaic collector can be optimized for a particular wavelength of electromagnetic radiation. However solar radiation consists of a wide range of wavelengths. The energies of individual photons of the radiation varies with the wavelength according to a well-known physical law.

If the photon is absorbed but its energy is less than the energy band gap of the photovoltaic junction then its energy is converted to heat, not to electricity. If the photon is absorbed and its energy is more than the energy band gap, then only that energy corresponding to the band gap is converted to electricity—excess energy is dissipated as heat.

In addition, there are loss mechanisms whereby some of the electric current which is initially produced, is lost before it leaves the photovoltaic array. These loss mechanisms result in less electricity and more heat.

It is desirable for as much as possible of the incident radiation to be converted to electricity. In practice, however more than $\frac{2}{3}^{rd}$ of the incident energy is converted to heat, and less than $\frac{1}{3}^{rd}$ is converted to electricity.

Most photovoltaic installations generate electricity only. There is generally no attempt to recover the heat or to convert the heat to electrical energy. One of the aims of embodiments is to change this situation, so that the heat which is produced in the photovoltaic array is used to generate additional electricity over and above that which can be generated by the photovoltaic process.

In certain embodiments, heat is collected from the photovoltaic array using a thermic oil which is capable of operating at temperatures up to 400° C. This is the highest temperature that can be generally be accommodated by known thermic oils.

Higher temperatures could require the use of molten salt, which solidifies at low temperatures. This would entail maintaining the salt at temperatures above its melting point at all times. Thermic oil on the other hand is liquid at normal ambient temperatures.

It is noted that yet another possible downside to operating at temperatures higher than 400° C., is that the PV efficiency declines even further at such higher temperatures.

It is further noted that the use of thermic oil to collect solar heat focused by parabolic reflectors is known. However, these are not photovoltaic systems, as power is usually generated by a conventional steam Rankine cycle.

Embodiments may also address the problem of storing the electrical energy so that it can be used at times of high demand. In this way, the electrical energy which is generated by a renewable source at times, which are determined by the natural change from night to day and by the vagaries of the weather, becomes dispatchable so that it can be delivered when the customer wants it. This may be done by storing the electrical energy in the form of compressed air and by storing heat in a suitable heat store.

The absence of energy storage in wind and solar energy installations is beginning to cause problems in those countries where non-dispatchable renewable energy sources form a significant proportion of the total electrical generation. In some cases when excess renewable power is available, plants have to be shut down and generating companies have to be paid not to generate power for the electricity grid. Therefore it is desirable to have the capability to store energy, so that renewable energy can be made dispatchable.

Figure 4:
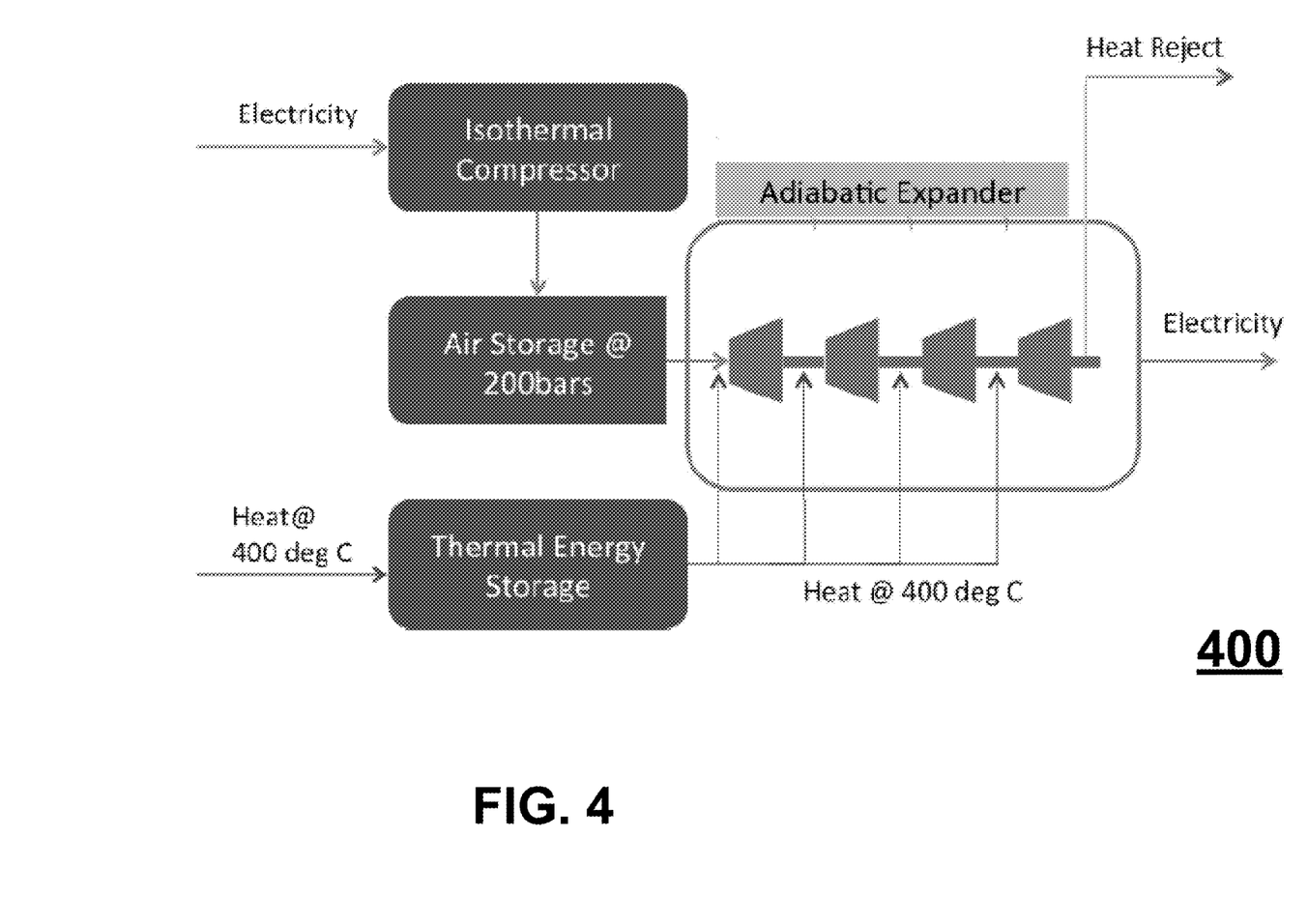
FIG. 4 is a simplified view of an energy storage system according to an embodiment.

In order to regenerate electricity, the air could be heated with heat supplied from solar power (or another source), and expanded in a multi-stage adiabatic expander. FIG. 4 is a simplified view of a hybrid energy storage system according to a particular embodiment.

Systems and/or methods according to embodiments, could utilize isothermal compression in order to store intermittent solar electricity in the form of compressed air. In particular embodiments, water is sprayed into the compression volume to absorb the heat of compression.

Certain compressed gas energy storage approaches are described in U.S. Patent Publication No. 2011/0115223 ("the Publication"), which is incorporated by reference in its entirety herein for all purposes. A principle behind these approaches is that by spraying very fine water droplets inside a compression chamber, a limited rise in the air-water mixture temperature can be achieved, since water acts as an effective heat exchanger and storage medium. This improves the compression efficiency by reducing the amount of work required from the piston.

According to the Publication, gas may be compressed in the presence of liquid water as a heat exchange medium. That is, heat generated from the compression of gas is transferred across a gas-liquid boundary (e.g. fine droplets), such that the temperature experienced by the gas remains within a relatively small range over the course of the course of the compression cycle. This enhances the thermodynamic efficiency of the compression process. The transferred heat of gas compression may be retained in the heated water, and may be available for other uses.

A compressor as described in the Publication, may utilize a reciprocating or rotating moveable member for gas compression. An example of the former is a solid piston connected to a mechanical linkage comprising a piston rod and rotating shaft (e.g. crankshaft). An example of the latter is a rotating turbine, screw, or other structure connected to a mechanical linkage comprising a rotating shaft.

In certain embodiments, liquid may be introduced directly into the compression chamber for heat exchange. In certain embodiments, liquid may be introduced to gas in a mixing chamber upstream of the compression chamber.

After the near-isothermal compression shown in FIG. 4, the air is stored at ambient temperature, either aboveground in pressure vessels, or underground. Particular embodiments may employ pressure vessels made from composite materials, including but not limited to those described in U.S. Patent Publication No. US 2013/0186597, which is incorporated by reference in its entirety herein for all purposes.

Embodiments may then regenerate electricity by introducing pre-heated air inside a multi-stage adiabatic expander. That adiabatic expander may comprise a mix of reciprocating piston expanders and turbines, including but not limited to the specific configuration 400 of FIG. 4.

In particular embodiments, the adiabatic expander may be capable of handling temperatures of up to about 400° C., which is within the temperature range of a commercially available thermic oil. Such an operating temperature may also represent a favorable compromise of high grade heat conducive to high efficiency, and a low enough temperature so that relatively cheap steel can be used. Such embodiments may potentially avoid the need to use more expensive metals such as Nickel alloys.

As shown in FIG. 4, to enhance the electricity regeneration, compressed air may be heated up before each successive expansion stage by extracting heat from a thermic oil using a counterflow heat exchanger.

For one particular system that is configured to deliver 57 kW of electricity, a power output may be 57.1 kW of electricity, and a compression power may be 44.3 kW of electricity. During electricity generation, a thermic oil flow may be 0.148 kg/s from the inlet @400° C., down to a temperature of 196° C.

These sample values may vary as the air tank pressure decreases during electrical generation. The resulting system exergy budget for a 10 h system with 50 kW average power delivery can be estimated as is shown in the simplified view of FIG. 5.

Figure 5:
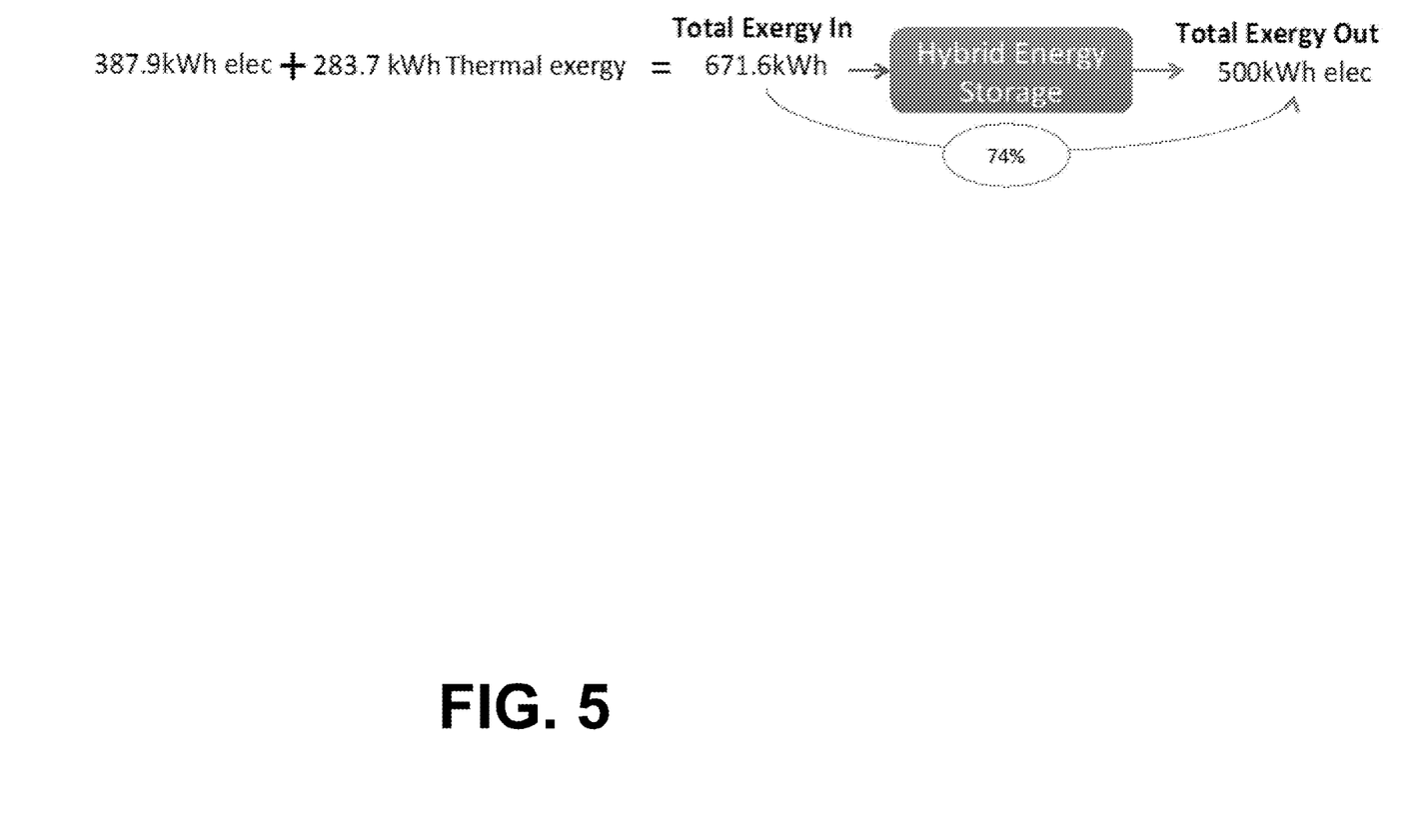
FIG. 5 is a simplified view showing energy inflows and outflows from an exemplary system according to an embodiment.

In particular, FIG. 5 represents a total exergy efficiency of 500/671.6=74.4%. The target efficiency would be 70.8% based on an electricity exergy fraction of 57.8%.

Here, it is convenient to discuss the energy transfers in terms of exergy, since the use of this quantity makes allowance for the fact that electrical energy and thermal energy are not equivalent, since depending on temperature, only a certain fraction of the available heat can be converted to electricity.

Exergy takes some account of this. The exergy of a source of heat is the theoretical maximum amount of mechanical or electrical energy that can be produced assuming a thermodynamically perfect heat engine, which operates on the theoretical Carnot cycle.

This definition of exergy requires the specification of a temperature at which the perfect heat engine can reject heat. For present purposes, it is assumed that this heat rejection temperature is 310° K.

By expressing the electrical and thermal components of energy in terms of exergy, it is possible to combine them and to assess the overall performance of the hybrid energy storage and recovery system. Thus, the data in FIG. 5 indicates that the recovery and production of electrical energy from the stored combination of electrical and thermal energy amounts to 74% of what could theoretically be achieved in a perfect thermodynamic system with no losses.

In certain embodiments, thermal energy storage system and cost could be mutualized with solar conversion systems that also require such heat storage.

Figure 6:
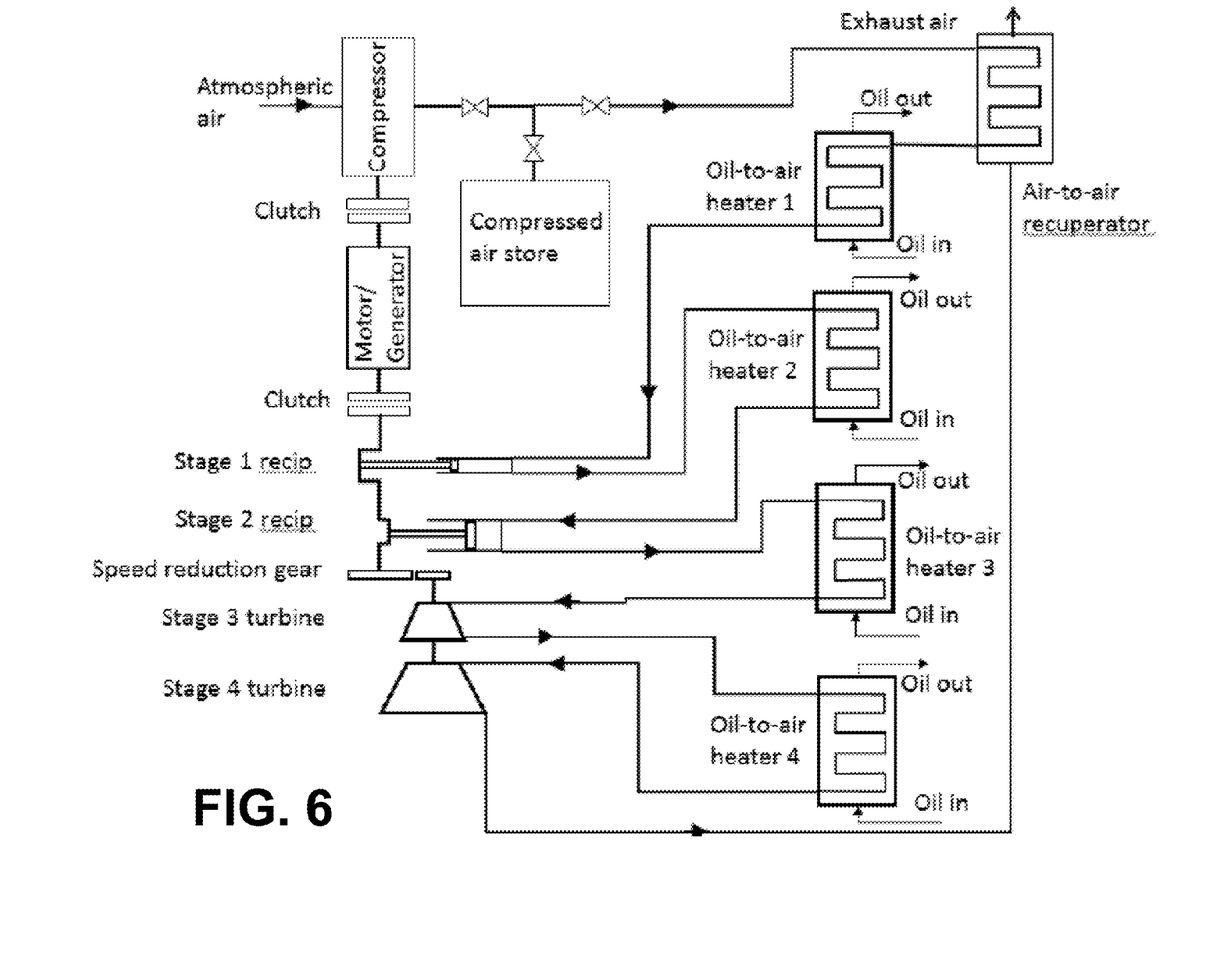
FIG. 6 shows a simplified diagram of an embodiment of an expander apparatus which may be employed according to certain embodiments.

FIG. 6 is a simplified view illustrating details of one particular embodiment of an adiabatic expander that could be employed according to embodiments. Incorporated by reference herein for all purposes, are the following United States patent applications describing various expander apparatuses: U.S. Nonprovisional patent application Ser. No. 13/836,790; and U.S. Nonprovisional patent application Ser. No. 14/037,217.

The specific arrangement shown in FIG. 6 employs certain features designed to enhance the efficiency and reduce the cost. The particular embodiment shown in FIG. 6 employs four stages of expansion, with two reciprocating stages and two turbine stages.

This is not necessarily fixed and a different number of expansion stages could be considered. The number of expansion stages is choice related to performance and cost.

Generally the fewer the stages, the lower the cost. However, if the overall pressure ratio and the maximum air temperature are fixed and there are too few expansion stages, then the minimum temperature of heat addition at each expansion stage may be reduced. This is because it known from Carnot's Law that the efficiency of a cycle depends on the average temperature of heat addition, which depends on both the minimum and the maximum temperature of heat addition.

Another feature of the embodiment of FIG. 6, is the inclusion of an air-to-air recuperator. This air-to-air recuperator allows for recovery of the heat remaining in the expanded air after the last stage of expansion.

In particular, the air which is recovered from the compressed air energy store may be filtered and kept clean in order to use compact heat transfer geometries of small hydraulic diameter without clogging. This can greatly reduce the size and cost of the heat exchangers.

Embodiments may be operated to ensure that the flow rates of thermic oil and of air taken from the compressed air store, have matching thermal capacities. This allows the temperature difference between the oil and the air to be kept low, along the length of the heat exchanger. This in turn maximizes the efficiency of the system. In the case of the recuperator, both the primary and secondary sides can comprise air at the same flow rate, so close thermal matching may be inherent in the system.

The use of a compact heat transfer geometry with a small hydraulic diameter may be particularly desirable for the case of low pressure air, since the heat transfer coefficient is relatively poor in this case. One way of achieving this may be to have the low pressure air flowing through close-packed fins on the outer surface of tubes containing the other fluid. That other fluid may be thermic oil (in the case of oil-to-air heater no. 4) or may be high pressure air (in the case of the air-to-air recuperator).

High pressure air exhibits a better heat transfer coefficient, and in this case the priority is to have a cost-effective way of containing the high pressure. This can be conveniently done by transporting the high pressure air in small bore tubing without internal heat transfer enhancement.

Alternatively, other types of compact heat exchanger may be used. Examples include a plate heat exchanger, a plate-fin heat exchanger, or a plate-shell heat exchanger that could be used depending on the air pressure and required flow rates. In principle, it is expected that different heat exchanger geometries may be chosen for each of the heat exchangers of FIG. 6, given the variance in conditions from one to the other.

Another design issue concerns the type of expander used. In principle, a particular expansion stage could be either a reciprocating unit or a rotodynamic unit. Other types of expander are also possible, such as for example screw expander type or sliding vane type.

A rotodynamic system such as an axial turbine, exhibits low mechanical friction and can deal effectively with high volume flow rates. While aerodynamic efficiency of small rotodynamic machines is relatively low, this efficiency increases with size, partly because leakage flow rates are reduced.

A reciprocating system offers a higher mechanical friction, but the aerodynamic losses can be reduced if a low or moderate mean piston speed is chosen so that the valve pressure losses are minimized. However, a low mean piston speed results in a physically large system with a low volumetric flow capacity.

These different features generally favor the use of turbines for the low pressure stages where the volumetric flow rate is high and where low mechanical friction is also particularly important. On the other hand, the high pressure stages have a low volumetric flow rate, such that a reciprocating assembly with low aerodynamic losses can be advantageous.

Another possible reason for choosing a reciprocating expander for the high pressure stages is the fact that the air source pressure varies over a wide range, such as from a maximum of about 200 bar down to a minimum of around 40 or 50 bar. This variation occurs as the compressed air store is gradually depleted.

If the timing of the closure of the air inlet valve on a reciprocating expander is controllable, then it is possible to maintain a high efficiency over a wide range of inlet pressures. It is possible to apply some control of a turbine expander by using adjustable inlet guide vanes, but the range of adjustment is not so large and there may be a greater loss of efficiency.

One possible consequence of embodiments having both reciprocating and rotodynamic expanders in the same system, is the mismatch in rotational speed between the two types. The rotodynamic expander would operate at a much higher speed (e.g. in the region of 30,000 rpm). By contrast, the piston expanders may operate at around 1200 rpm.

Thus, embodiments could employ a speed reduction gear to transmit the turbine power to the shaft connected to the reciprocating pistons. This is shown in FIG. 6.

FIG. 6 also shows two clutches allowing three possible modes of operation, which are described here in the context of use of the system with a hybrid solar photovoltaic system. The three modes of operation are generation mode (G), energy storage mode (S) and energy recovery mode (R).

Figure 7:
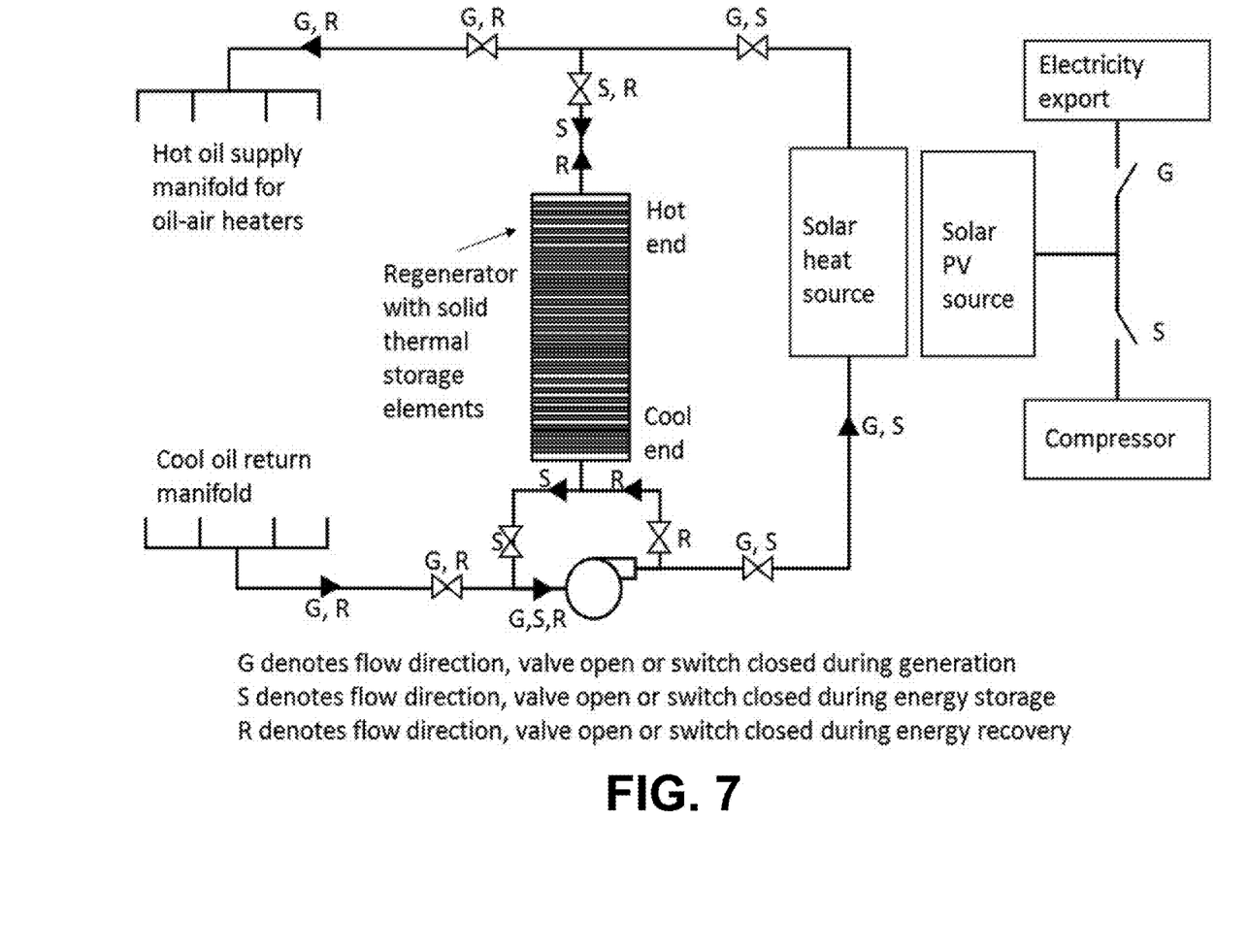
FIG. 7 shows how a thermal regenerator can be operated with an expander and hybrid solar plant in different modes of generation, energy storage and energy recovery.

The operation of the system in the three different modes is controlled by the two clutches shown in FIG. 6 and by the valves and switches of FIG. 7. FIG. 7 shows operation of an embodiment of the energy storage system in three different modes.

In the generation mode (G), both clutches shown in FIG. 6 are engaged, and the system generates power using the solar thermal power delivered by hot oil to provide the heat for expansion. Some of the expansion power is used to drive the compressor using the mechanical connection via the motor-generator and the clutches. The remaining expansion power is converted to electricity using the motor generator and exported.

In addition to this, the hybrid solar plant produces photovoltaic electricity which can also be exported directly to the grid or other load. In this operation mode, the system acts as a pure generator and no use is made of either the compressed air store or of the thermal store.

FIG. 7 shows the corresponding flow circuit for the thermic oil through the solar heat source, the thermal regenerator, and the oil-air heaters. The letter G indicates which of the valves are open during the generation mode and the arrows with the letter G indicate the flow direction of the oil during generation.

FIG. 7 also indicates the electrical connection of the solar PV source in the different modes of operation. The letter G indicates which of the two switches is closed during generation.

In the storage mode of operation in which both the electrical and the thermal outputs of the hybrid solar plant are stored, only the clutch connected to the compressor (shown in FIG. 6) is engaged, while the clutch connected to the expander is disengaged. In this case the system can be used to store energy from the photovoltaic source as compressed air.

Heat from the thermal part of the hybrid solar plant is also stored at the same time. This is done by circulating the thermic oil through the thermal regenerator. This process is illustrated in FIG. 7, where the operation in storage mode is indicated by the letter S.

In the recovery mode of operation, the clutch connected to the expander (shown in FIG. 6) is engaged, but the clutch connected to the compressor is disengaged. In this case, the hybrid solar plant is not producing any electric or thermal energy, but the overall system can recover energy which has previously been stored to deliver power for export to the grid or elsewhere.

This is done by taking compressed air from the compressed air storage system and by extracting heat from the thermal regenerator. The operation of the various valves and switches to achieve this is indicated by the letter R in FIG. 7.

It is noted that the pump used for transporting the oil, which is shown in FIG. 7, maintains its flow in the same direction in all three operational modes. However the actual path of the oil is controlled by the valves. In particular the operation of the valves reverses the direction of oil flow through the regenerator when the system is changed from the energy storage mode to the energy recovery mode.

The regenerator is preferably arranged vertically with the hot end upwards. This minimizes natural convection effects, which would otherwise disrupt the temperature distribution in the regenerator.

When heat is stored, the hot oil from the solar plant causes a hot temperature front to progress down through the solid elements towards the bottom. When the hot front reaches the bottom of the regenerator, it is fully charged.

Thermal energy recovery is the reverse process. In this case, cooled oil returning from the oil-air heaters flows in at the bottom of the regenerator and a cool front progresses upwards. When the cool front reaches the top, then the regenerator is fully discharged.

By suitable management of the system described above, it is possible to maintain an efficient supply of electric power at all times of the day and night. Thus the intermittent source of renewable solar power can be converted into a dispatchable generator of electricity, which can respond to the fluctuations in demand.

Embodiments of energy storage systems as described herein can be contrasted with various conventional approaches that may offer one or more possible shortcomings. One potential disadvantage of some conventional systems is reliance upon an adiabatic compression cycle that is wasteful of the heat produced. Another shortcoming of conventional approaches may be air storage at low pressures (<90 bars) and energy density.

Still another shortcoming of conventional systems may be their deployment only within suitable geology (e.g. abandoned mines, salt domes etc.) In contrast with such conventional systems, embodiments may leverage advances allowing gas storage in flexible, low cost pressure vessels, such as those of composite design.

Embodiments could result in a paradigm shift for solar power developers, allowing them to compete head-to-head with conventional fuels by offering dispatchable clean solar power, considerably reducing the need for grid investments. Embodiments may also open up a large market for peak reduction and low to medium grade heat recovery at industrial sites.

1b. An apparatus comprising:
a gas compressor configured to compress gas within a first temperature range;
a compressed gas storage unit in fluid communication with the gas compressor; and
a gas expander configured to receive compressed gas from the compressed gas storage unit, and to expand the compressed gas within a second temperature range in conjunction with heat received from a heat source, wherein the second temperature range is larger than the first temperature range, and wherein the gas expander is configured to drive an electrical generator.

2b. An apparatus as in clause 1b wherein the gas compressor is configured to compress the gas in the presence of a heat exchange liquid.

3b. An apparatus as in clause 1b wherein the gas compressor is configured to be driven by electricity from a solar collector.

4b. An apparatus as in clause 1b wherein the gas compressor comprises a reciprocating piston.

5b. An apparatus as in clause 1b wherein the gas compressor comprises a rotating turbine.

6b. An apparatus as in clause 1b further comprising a counterflow heat exchanger between the heat source and gas expander.

7b. An apparatus as in clause 1b wherein the gas expander is in thermal communication with the heat source through a heat transfer fluid.

8b. An apparatus as in clause 7b wherein the heat transfer fluid comprises a thermic oil.

9b. An apparatus as in clause 7b wherein the gas expander is in thermal communication with the heat source through a thermal storage medium.

10b. An apparatus as in clause 9b wherein the thermal storage medium comprises the heat transfer fluid.

11b. An apparatus as in clause 1b wherein the heat source comprises a solar collector.

12b. An apparatus as in clause 1b wherein the gas expander comprises a plurality of stages.

13b. An apparatus as in clause 12b wherein one stage comprises a reciprocating piston, and another stage comprises a rotating turbine.

14b. An apparatus as in clause 1b further comprising a counterflow heat exchanger configured to communicate the heat from the heat source to the expander.

15b. A method comprising:
converting electrical energy from a solar collector to compressed gas within a first temperature range;
storing the compressed gas at a first time;
expanding the compressed gas within a second temperature range greater than the first temperature range in the presence of thermal energy communicated from the solar collector; and
at a second time subsequent to the first time, driving a generator from expansion of the compressed gas.

16b. A method as in clause 15b wherein the first temperature range results from gas compression in the presence of a heat exchange liquid.

17b. A method as in clause 15b wherein the compressed gas is expanded in a plurality of stages.

18b. A method as in clause 15b wherein the thermal energy is communicated to a counterflow heat exchanger.

19b. A method as in clause 15b wherein the thermal energy is communicated utilizing a heat transfer fluid.

20b. A method as in clause 19b wherein the heat transfer fluid comprises a thermic oil.

21b. A method as in clause 19b further comprising storing the thermal energy in a thermal storage medium.

22b. A method as in clause 21b wherein the thermal storage medium comprises the heat transfer fluid.

23b. A method as in clause 15b wherein the compressed gas is expanded in multiple stages.

24b. A method as in clause 23b wherein one expansion stage comprises a rotating turbine, and another expansion stage comprises a reciprocating piston.

Although the present invention has been described with reference to certain embodiments, modifications and varations are possible and would be apparent to one of skill in the art. Therefore, the spirit and scope of the invention should not be limited to the description provided herein.

What is claimed is:

1. An apparatus comprising:
    a hybrid solar concentrator comprising:
        a heat receiver;
        one or more dielectric mirrors to isolate components of solar spectrum compatible with specific PV bandgaps and to pass a selected range of wavelengths through to the heat receiver, generating both electricity and heat from a single set of dual-axis heliostats;
    a first compressor in communication with a first power source and configured to operate within a first temperature range;
    a compressed gas storage unit in fluid communication with the first compressor;
    a second compressor in communication with a second power source and configured to further compress gas received from the compressed gas storage unit in the presence of a phase change material, the second compressor configured to operate within a second temperature range larger than the first temperature range;
    a first expander configured to expand gas received from the second compressor in the presence of a supercritical phase change material heated by a thermal energy source comprising the heat from the hybrid solar collector, the first expander configured to operate within a third temperature range; and
    a second expander configured to further expand gas received from the first expander in the presence of a phase change material, the second expander configured to operate within a fourth temperature range larger than the third temperature range.

2. An apparatus as in claim 1 wherein the compressed gas comprises air, the phase change material of the second compressor comprises water, and the supercritical phase change material comprises water.

3. An apparatus as in claim 1 wherein the first compressor is configured to operate in the first temperature range by injection of a heat transfer liquid.

4. An apparatus as in claim 3 wherein the heat transfer liquid is separated from an output of the first compressor.

5. An apparatus as in claim 1 wherein the first expander is configured to operate in the third temperature range by the injection of a heat transfer liquid.

6. An apparatus as in claim 5 wherein the heat transfer liquid is separated from an output of the first expander.

7. An apparatus as in claim 5 wherein the thermal energy source is in communication with the heat transfer liquid prior to injection into the first expander.

8. An apparatus as in claim 7 wherein the thermal energy source is in communication with the heat transfer liquid via a thermal store.

9. An apparatus as in claim 5 wherein the supercritical phase change material comprises water, and the thermal energy source comprises a salt mixture having a melting point below a bottom point of the third temperature range.

10. An apparatus as in claim 1 wherein the first power source comprises electricity from the hybrid solar collector.

11. An apparatus as in claim 1 wherein the second power source comprises electricity from the hybrid solar collector.

12. An apparatus as in claim 1 further comprising a liquid injector positioned between the compressed gas storage unit and the first expander.

13. A solar energy conversion system comprising:
    one or more heliostat mirrors having two-axis trackers, focusing sunlight onto a central tower;
    one or more dielectric mirrors near a focal point, allowing a first range of wavelengths to pass through and reflecting a second range of wavelengths outside the first range;
    PV cells converting the first range of wavelengths to electricity;
    a heat receiver;
    a first compressor in communication with a first power source and configured to operate within a first temperature range;
    a compressed gas storage unit in fluid communication with the first compressor;
    a second compressor in communication with a second power source and configured to further compress gas received from the compressed gas storage unit in the presence of a phase change material, the second compressor configured to operate within a second temperature range larger than the first temperature range;
    a first expander configured to expand gas received from the second compressor in the presence of a supercritical phase change material heated by a thermal energy source comprising the heat receiver, the first expander configured to operate within a third temperature range; and
    a second expander configured to further expand gas received from the first expander in the presence of a phase change material, the second expander configured to operate within a fourth temperature range larger than the third temperature range.

14. A solar energy conversion system as in claim 13 wherein the first power source comprises electricity from the PV cells.

15. A solar energy conversion system as in claim 13 wherein the second power source comprises electricity from the PV cells.

16. A solar energy conversion system as in claim 13 wherein the heat receiver is in communication with a heat transfer liquid.

17. A solar energy conversion system as in claim 13 wherein the heat receiver is in communication with a thermal store.

* * * * *